United States Patent [19]

Davis et al.

[11] 4,251,594
[45] Feb. 17, 1981

[54] PROCESS FOR PREPARING RESIN IMPREGNATED SUBSTRATES FOR USE IN PREPARING ELECTRICAL LAMINATES

[75] Inventors: William Davis, Lake Jackson; Ross C. Whiteside, Jr., Angleton, both of Tex.

[73] Assignee: The Dow Chemical Company, Midland, Mich.

[21] Appl. No.: 79,282

[22] Filed: Sep. 27, 1979

[51] Int. Cl.$^3$ ............................................. B32B 27/38
[52] U.S. Cl. ...................................... 428/413; 427/58; 427/372.2
[58] Field of Search .................. 427/58, 386, 413–417, 427/418, 458, 480, 542, 929, 372.2; 428/413

[56] References Cited

U.S. PATENT DOCUMENTS

| 3,306,872 | 2/1967 | Maycock et al. | |
| 3,480,471 | 11/1969 | Rembold | 117/161 |
| 3,679,465 | 7/1972 | Flynn | 117/126 GE |
| 3,687,894 | 9/1972 | Collings et al. | 260/47 EC |
| 3,738,862 | 6/1973 | Kharquist | 117/126 GE |
| 3,998,983 | 12/1976 | Smith | 427/374 R |
| 4,075,260 | 2/1978 | Tsen | 427/386 |
| 4,168,331 | 9/1979 | Davis | 427/58 |

FOREIGN PATENT DOCUMENTS 1434889 5/1976 United Kingdom .

Primary Examiner—Bernard D. Pianalto
Attorney, Agent, or Firm—J. G. Carter

[57] ABSTRACT

The preparation of substrates impregnated with epoxy resins and curing agents therefor is improved by employing as the epoxy resin one which has been prepared by reacting a low equivalent weight epoxy resin having an aliphatic halide content of at least about 500 ppm such as a diglycidyl ether of bisphenol A with a dihydric phenolic compound such as tetrabromo bisphenol A in the presence of an alkali metal hydroxide such as potassium hydroxide.

6 Claims, No Drawings

PROCESS FOR PREPARING RESIN IMPREGNATED SUBSTRATES FOR USE IN PREPARING ELECTRICAL LAMINATES

FIELD OF THE INVENTION

Electrical laminates have been prepared from substrates impregnated with epoxy resins and curing agents therefor employing as the epoxy resin one which has been prepared from a diglycicyl ether and a dihydric phenolic compound employing as a catalyst a phosphonium compound or an ammonium hydroxide. Electrical laminates when prepared from such substrates have inferior pressure cooker-solder test results and/or thermal stability test results.

It has now been unexpectedly discovered that when the phosphonium and/or ammonium catalyst is replaced by an alkali metal hydroxide catalyst that the resultant electrical laminates possess improved pressure cooker-solder test results and the glass transition temperature is increased and in some instances an improvement in one or more physical properties of the electrical laminates is obtained.

SUMMARY OF THE INVENTION

The present invention pertains to an improvement in a process for preparing resin impregnated substrates for use in preparing electrical laminates which comprises:
(I) saturating said substrate with a resin forming mixture comprising;
 (A) an epoxy resin having an epoxide equivalent weight of from about 300 to about 600, preferably from about 375 to about 475 which has been prepared by reacting
  (1) a glycidyl ether of a dihydric phenol having an average of more than one epoxide group per molecule and an epoxide equivalent weight (EEW) of from about 156 to about 400, preferably from about 177 to about 190, with
  (2) a dihydric phenolic compound in the presence of
  (3) a catalyst for effecting the reaction between 1 and 2;
 (B) a curing agent for said epoxy resin and
 (C) a solvent system for Components A and B;
(II) heating the resultant impregnated substrate to B-stage the resin and remove the solvent system; the improvement which comprises
 (a) employing as the catalyst, Component (A-3), an alkali metal hydroxide and
 (b) employing as the glycidyl ether of a dihydric phenol, Component (A-1), one which has an aliphatic halide content of at least about 500 parts per million (ppm) by weight.

DETAILED DESCRIPTION OF THE PREFERRED EMBODIMENTS

Suitable glycidyl ethers of a dihydric phenol which can be employed in the present invention include those represented by the formula

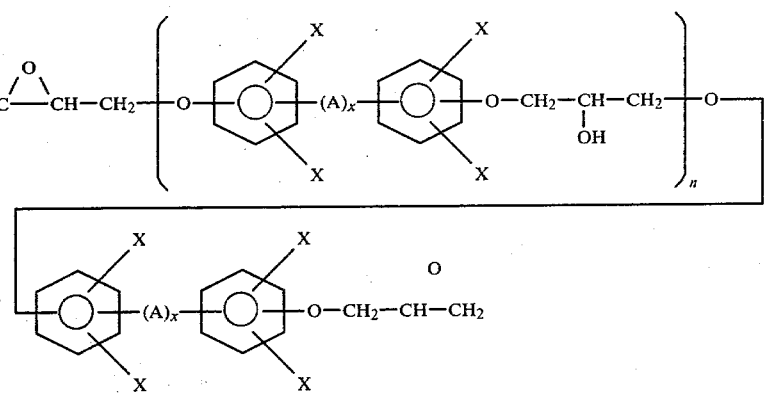

wherein A is a divalent hydrocarbon group having from 1 to about 8 carbon atoms,

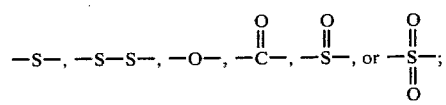

each X is independently hydrogen, chlorine or bromine; x has a value of zero or one and n has a value such that the EEW is from about 156 to about 400 preferably from about 177 to about 190.

Particularly suitable are the diglycidyl ethers of bisphenol A and tetrabromobisphenol A.

The glycidyl ethers employed herein must have an aliphatic halide content of at least about 500 ppm, preferably at least about 1000 ppm, and most preferably at least about 2000 ppm.

Below about 500 ppm, there is a great tendency for the reactants to proceed in such a manner so as to gel in the reaction vessel causing difficulties in the production of the resin useful in the process of the present invention. While the upper limit as to aliphatic halide is not critical, large quantities necessitate in the employment of inordinate amounts of alkali metal catalyst; therefore optimum ranges for the aliphatic halide content is from about 500 ppm to about 10,000 ppm, preferably from about 1000 ppm to about 6000 ppm and most preferably from about 2000 ppm to about 4000 ppm.

Suitable dihydric phenolic compounds include, for example, catechol, hydroquinone, resorcinol and bisphenols such as those represented by the formula

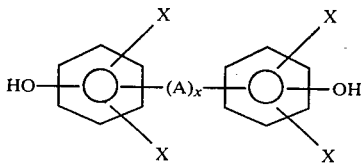

wherein X, A and x are as defined above.

Particularly suitable dihydric phenolic compounds are bisphenol A and tetrabromo bisphenol A.

The dihydric phenol and the glycidyl ether of a dihydric phenol are employed in quantities such that the phenolic OH:epoxide equivalent ratio is from about 0.2:1 to about 0.35:1 preferably from about 0.24:1 to about 0.31:1.

Suitable alkali metal hydroxides include, for example, sodium hydroxide, lithium hydroxide, potassium hydroxide, cesium hydroxide, mixtures thereof and the like. Particularly suitable alkali metal hydroxides include, for example, sodium hydroxide and potassium hydroxide.

The quantity of alkali metal hydroxide catalyst employed is dependent upon the aliphatic halide concentration, total reaction mass, type of reaction vessel and the degree of branching desired for a given amount of improvement in pressure cooker-solder dip resistance.

In general the alkali metal hydroxide catalyst is employed in quantities of from about 0.05 to about 1.0, preferably from about 0.10 to about 0.80 and most preferably from about 0.20 to about 0.60 hydroxide equivalent per aliphatic halide equivalent contained in the glycidyl ether employed.

Quantities of catalyst less than about 0.05 hydroxyl equivalent per aliphatic halide equivalent tend to promote only epoxy-phenolic linear reactions which result in a resin which is usually equivalent to but not superior to resins prepared with phosphonium catalysts.

Quantities of catalyst above about one hydroxyl equivalent per aliphatic halide equivalent do not allow for catalyst deactivation which results from reaction of the alkali metal hydroxide with the aliphatic halide to form the alkali metal halide salt. This usually results in an uncontrolled epoxy hydroxyl reaction which leads to undesirable gelation.

Suitable curing agents include, for example, guanidines such as dicyandiamide and tetramethyl guanidine and biguanides such as 2,6-xylene biguanide.

The curing agent is employed in quantities of from about 2 to about 8 preferably from about 3 to about 4 parts by weight per 100 parts of resin solids.

Suitable solvents include, for example, the oxygenated solvents such as acetone, methylethyl ketone, cyclohexanone, diacetone alcohol, mixtures thereof and the like, and the glycol ethers such as ethylene glycol ethyl ether acetate; ethylene glycol methyl ether; ethylene glycol n-butyl ether; diethylene glycol ethyl ether; diethylene glycol n-butyl ether; propylene glycol methyl ether; dipropylene glycol methyl ether; mixtures thereof and the like and in admixture with aromatic solvents such as, for example, xylene, toluene, ethylbenzene and the like. Other suitable solvents include the halogenated solvents such as trichloroethylene, methylene chloride and the like and dimethyl formamide and the like.

The solvents are usually employed in quantities of from about 30 to about 80 preferably from about 40 to about 60 percent by weight based upon the total formulation.

Other components which can be included are accelerators such as, for example, imidazoles, benzyl dimethylamine, metaphenylene diamine, N,N,N',N'-tetramethyl-1-3-butanediamine and the like.

The accelerators are usually employed in quantities of from about 0.05 to about 1.0 preferably from about 0.1 to about 0.6 parts by weight per 100 parts resin solids.

Other components include wetting agents, colorants, fillers and the like.

Suitable substrates include, for example, fiberglass, polyester, and the like in woven or mat form.

The following examples are illustrative of the present invention and are not to be construed as to limiting the scope thereof in any manner.

EPOXY RESIN A (Present Invention)

To a 10 gal. (37.85 l.) reaction vessel was added 14.66 kg (78.4 equiv.) of a liquid diglycidyl ether of bisphenol A having an average epoxide equivalent weight (EEW) of 187 and an aliphatic chloride content of 3090 parts per million (ppm) by weight and 5.73 kg (21.07 equiv.) of tetrabromobisphenol A having an average phenolic hydroxyl equivalent weight (PHEW) of 272. After heating with stirring to a temperature of 80° C., 1400 parts per million (ppm) by weight, based upon the liquid epoxy resin of potassium hydroxide was added. The temperature was then maintained at 150° C. for 1½ hours at which time the contents were diluted with 6.8 kg of acetone to provide a composition containing 75% solids or non-volatiles content by weight. The product was then filtered so as to remove the spent catalyst which was in the form of potassium chloride. The resulting resin on a 100% solids or non-volatiles basis had an average EEW of about 410.

EPOXY RESIN B (Comparative)

To a 10 gal. (37.85 l.) reaction vessel was added 13.18 kg (70.5 equiv.) of a liquid diglycidyl ether of bisphenol A having an average EEW of 187 and an aliphatic chloride content of 3090 ppm by weight, 4.88 kg (17.9 equiv.) of tetrabromobisphenol A having an average PHEW of 272 and 13.5 grams of tetramethyl ammonium hydroxide. The mixture was heated to 170° C. with stirring and held thereat for two hours after which the contents were diluted with 4.5 kg of acetone to provide a composition containing 75% solids or non-volatiles content by weight. The resulting resin on a 100% solids basis had an average EEW of about 440.

EPOXY RESIN C (Comparative)

A laminating resin was produced by reacting 4.614 Kg (24.67 equiv.) of a liquid glycidyl ether of bisphenol A having an average EEW of 187 and an aliphatic halide content of 3090 ppm with 2.386 kg (8.77 equiv.) of tetrabromobisphenol A having an average PHEW of 272 in the presence of 3.29 grams of a 70% solution of ethyl triphenyl phosphonium acetate.acetic acid complex in methanol at a temperature of about 150° C. for about 1.5 hours. The resin was then diluted with about 2333 grams of acetone to a solids or non-volatiles level and 75% by weight. The resultant epoxy resin had an average EEW on a 100% solids or non-volatiles basis of about 440.

EPOXY RESIN D (Comparative)

A laminating resin was prepared employing the procedure of Example III of U.S. Pat. No. 4,075,260 by reacting 1875.5 g (8.93 equiv.) of Epon® 829 with a mixture of 890.5 g (3.27 equiv.) of tetrabromobisphenol A having an average PHEW of 272 and 384 g (3.37 equiv.) of bisphenol A having an average PHEW of 114. The resultant resin which had an average EEW of 1433 was then blended with 1850 g (9.73 equiv.) of Epon® 828 having an average EEW of 190 and 1665 g of methyl cellosolve. The resulting resin blend had an average EEW of 409 on a 100% solids or non-volatiles basis and a solids or non-volatiles content of 75%.

The above prepared epoxy resins were formulated into prepreg varnishes by blending with curing agent and solvent. The formulations are given in the following Table I.

B-staged impregnated cloth or prepreg had a gel time of 70 to 90 seconds at 175° C.

Laminates were then prepared from each of the above prepared preimpregnated fiberglass employing 5 plys of 12 in.×12 in.×0.13 in. (3 cm×3 cm×.33 mm) sheets of 7637 style glass with single plys of 7628 style glass on the outsides, all of which were I617 finish. The laminates were prepared by pressing at 500 psig (3500 kg/cm$^2$) for 60 minutes at 175° C. The laminates were then tested. The results of the tests are given in Table II with the laminates prepared from Example 1 designated as laminate 1 while those prepared from Comparative Experiment A are designated as laminate A.

The pressure cooker-solder test was conducted by
(i) cutting 2 in.×4 in. coupons from prepared laminates,
(ii) placing the coupons edgewise on a rack in a pressure cooker and maintaining 15 psig steam pressure for one hour, wiping the surface dry, and

TABLE I

|  | EXAMPLE 1 | COMPARATIVE EXPERIMENT A | COMPARATIVE EXPERIMENT B | COMPARATIVE EXPERIMENT C |
|---|---|---|---|---|
| EPOXY RESIN Type/grams[1] | A/7000 | B/6176 | C/6536 | D/5866 |
| CURING AGENT dicyandiamide, grams/phr[2] | 156/3 | 145/3 | 147/3 | 132/3 |
| Benzyl dimethylamine, grams/phr[2] | 3.64/0.07 | 18/0.39 | 12.25/0.25 | 8.8/0.3 |
| SOLVENT methyl ether of ethylene glycol, grams | 1170 | 1091 | 1100 | 990 |
| acetone, grams | 350 | 638 | 0 | 1400 |
| Viscosity of solution at 25° C., seconds, #2 Zahn cup | 25 | 26 | 23 | 26 |
| Reactivity, gel time in seconds at 175° C. measured 2 hours after mixing | 200 | 233 | 245 | 220 |

[1]Quantity of 75% resin in acetone. For example, in Example 1, 7000 × .75 or 5250 grams of epoxy resin A on a 100% basis was employed.
[2]phr = parts per 100 parts of epoxy resin solids.

PREPARATION OF LAMINATES

Fiberglass cloth was impregnated by passing it through each of the prepreg varnishes, followed by a pair of doctor bars set at 15 mils clearance to control resin pickup, and finally through an oven at 300° F. for a dwell time of approximately 4 minutes. The resulting (iii) then immersing the coupons in 500° F. solder for 20 seconds.

The laminates must be free of blister after immersion in hot solder in order to pass. If the laminates passed, the test was repeated extending the dwell time in 15 psig steam to 2 hours.

The results are given in the following Table II with the laminate designation corresponding to the example or comparative experiment numbers.

TABLE II

|  | Laminate 1 (Present Invention) | Laminate A (Comparative) | Laminate B (Comparative) | Laminate C (Comparative) |
|---|---|---|---|---|
| Glass Transition Temp., °C. | 126 | 118 | 110 | 119 |
| Flexural Strength, psi (kg/cm$^2$) | 82.7(5.81) × 10$^3$ | 80.6(5.67) × 10$^3$ | 69.6(4.89) × 10$^3$ | 70.3(4.94) × 10$^3$ |
| Flexural Modulus, psi (kg/cm$^2$) | 3.88(0.273) × 10$^6$ | 3.73(0.262) × 10$^6$ | 3.04(0.214) × 10$^6$ | 3.51(0.247) × 10$^6$ |
| Tensile Strength, psi (kg/cm$^2$) | 59.2(4.16) × 10$^3$ | 56.6(3.98) × 10$^3$ | 53.1(3.73) × 10$^3$ | 64.2(4.51) × 10$^3$ |
| Tensile Modulus, psi (kg/cm$^2$) | 2.96(0.208) × 10$^6$ | 4.03(0.283) × 10$^6$ | 2.61(0.183) × 10$^6$ | 3.14(0.221) × 10$^6$ |
| Copper Peel Strength lbs/in (kg/cm) | 10.3(1.84) | 9.6(1.72) | 10.2(1.82) | 8.6(1.54) |
| Volume Resistivity, ohm-cm | All Laminates were >1.0 × 10$^{15}$ | | | |
| Disipation Factor, Condition A, 10$^5$ cycles | 0.01500 | 0.00580 | 0.00710 | 0.01700 |
| Dielectric Constant, Condition A, 10$^5$ cycles | 5.000 | 3.910 | 4.810 | 4.840 |
| Pressure-Cooker-Solder Test One Hour | | | | |
| Coupon No. 1 | pass | pass | fail | fail |
| Coupon No. 2 | pass | pass | fail | fail |
| Coupon No. 3 | pass | pass | pass | fail |
| Coupon No. 4 | pass | pass | fail | fail |
| Two Hour | | | | |
| Coupon No. 1 | pass | fail | — | — |
| Coupon No. 2 | pass | fail | — | — |
| Coupon No. 3 | pass | fail | — | — |

TABLE II-continued

| | Laminate 1 (Present Invention) | Laminate A (Comparative) | Laminate B (Comparative) | Laminate C (Comparative) |
|---|---|---|---|---|
| Coupon No. 4 | pass | fail | — | — |

We claim:

1. In a process for preparing resin impregnated substrates for use in preparing electrical laminates which process comprises:
   (I) saturating said substrate with a resin forming mixture comprising;
   (A) an epoxy resin having an epoxide equivalent weight of from about 300 to about 600, which has been prepared by reacting
   (1) a glycidyl ether of a dihydric phenol having an average of more than one epoxide group per molecule and an epoxide equivalent weight (EEW) of from about 156 to about 400, with
   (2) a dihydric phenolic compound in the presence of
   (3) a catalyst for effecting the reaction between 1 and 2;
   (B) a curing agent for said epoxy resin and
   (C) a solvent system for Components A and B;
   (II) heating the resultant impregnated substrate to B-stage the resin and remove the solvent system; the improvement which comprises:
   (a) employing as the catalyst, Component (A-3), an alkali metal hydroxide and
   (b) employing as the glycidyl ether of a dihydric phenol, Component (A-1), one which has an aliphatic halide content of at least about 500 ppm.

2. The process of claim 1 wherein Component (A-1) has an EEW of from about 170 to about 200 and an aliphatic halide content of from about 1000 ppm to about 6000 ppm; Components (A-1) and (A-2) are employed in quantities such that the phenolic hydroxyl to epoxide equivalent ratio is from about 0.2:1 to about 0.35:1 and the quantity of catalyst, Component (A-3), is that which provides from about 0.05 to about 1.0 hydroxyl equivalent per equivalent of aliphatic halide contained in Component (A-1).

3. The process of claim 2 wherein Component (A-1) has an EEW of from about 180 to about 195; Components (A-1) and (A-2) are employed in quantities such that the phenolic hydroxyl to epoxide equivalent ratio is from about 0.24:1 to about 0.31:1, and the quantity of catalyst, Component (A-3), is that which provides from about 0.10 to about 0.80 hydroxyl equivalent per equivalent of aliphatic halide contained in Component (A-1).

4. The process of claim 3 wherein Component (A-1) is diglycidyl ether of bisphenol A, Component (A-2) is tetrabromo bisphenol A and Component (A-3) is potassium hydroxide or sodium hydroxide and is employed in a quantity which provides from about 0.20 to about 0.60 hydroxyl equivalent per equivalent of aliphatic halide contained in Component (A-1).

5. A resin impregnated substrate prepared by the process of claims 1, 2, 3 or 4.

6. An electrical laminate prepared from the resin impregnated substrate of claim 5.

* * * * *